United States Patent
Adderly et al.

(10) Patent No.: US 9,087,839 B2
(45) Date of Patent: Jul. 21, 2015

(54) SEMICONDUCTOR STRUCTURES WITH METAL LINES

(71) Applicant: INTERNATIONAL BUSINESS MACHINES CORPORATION, Armonk, NY (US)

(72) Inventors: Shawn A. Adderly, Essex Junction, VT (US); Daniel A. Delibac, Colchester, VT (US); Zhong-Xiang He, Essex Junction, VT (US); Matthew D. Moon, Jeffersonville, VT (US); Anthony C. Speranza, Georgetown, TX (US); Timothy D. Sullivan, Underhill, VT (US); David C. Thomas, Richmond, VT (US); Eric J. White, Charlotte, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/853,301

(22) Filed: Mar. 29, 2013

(65) Prior Publication Data

US 2014/0291802 A1     Oct. 2, 2014

(51) Int. Cl.
H01L 21/20 (2006.01)
H01L 23/522 (2006.01)
H01L 49/02 (2006.01)
H01L 23/532 (2006.01)

(52) U.S. Cl.
CPC ...... H01L 23/5223 (2013.01); H01L 23/53223 (2013.01); H01L 28/60 (2013.01); H01L 2924/0002 (2013.01)

(58) Field of Classification Search
CPC ......... H01L 23/00; H01L 27/00; H01L 28/00; H01L 21/76802
USPC ................. 257/532, E21.008, 534, E21.582, 257/E29.001, 68; 438/381
See application file for complete search history.

(56) References Cited

U.S. PATENT DOCUMENTS

| | | | |
|---|---|---|---|
| 4,566,177 A | 1/1986 | van de Ven et al. | |
| 6,140,701 A | 10/2000 | Raina et al. | |
| 6,707,129 B2 | 3/2004 | Wang | |
| 6,893,905 B2 | 5/2005 | Raina et al. | |
| 7,094,636 B2 | 8/2006 | Manning | |
| 7,235,811 B2 | 6/2007 | Crowder et al. | |
| 7,378,343 B2 | 5/2008 | Chen et al. | |
| 7,582,901 B2 * | 9/2009 | Takeda et al. | 257/68 |
| 7,944,056 B2 | 5/2011 | Chang et al. | |
| 7,956,465 B2 | 6/2011 | Huang | |
| 8,084,864 B2 | 12/2011 | Chapple-Sokol et al. | |
| 8,551,856 B2 * | 10/2013 | Rennie et al. | 438/396 |
| 2003/0170975 A1 * | 9/2003 | Griffin et al. | 438/637 |

(Continued)

OTHER PUBLICATIONS

Kelsey-Wynne et al., "Characterization of Extrusion Formation During High Temperature Anneal", 2000 IEEE, IRW Final Report, pp. 161-164.

*Primary Examiner* — Telly Green
(74) *Attorney, Agent, or Firm* — David Cain; Roberts Mlotkowski Safran & Cole, P.C.

(57) ABSTRACT

Disclosed are semiconductor structures with metal lines and methods of manufacture which reduce or eliminate extrusion formation. The method includes forming a metal wiring comprising a layered structure of metal materials with an upper constraining layer. The method further includes forming a film on the metal wiring which prevents metal extrusion during an annealing process.

20 Claims, 5 Drawing Sheets

(56) References Cited

U.S. PATENT DOCUMENTS

| | | | |
|---|---|---|---|
| 2003/0190801 A1* | 10/2003 | Griffin et al. | 438/637 |
| 2004/0058531 A1* | 3/2004 | Hsieh et al. | 438/689 |
| 2005/0212082 A1* | 9/2005 | Takeda et al. | 257/534 |
| 2006/0125048 A1* | 6/2006 | Miki | 257/532 |
| 2010/0105164 A1* | 4/2010 | Ito et al. | 438/104 |
| 2011/0147847 A1* | 6/2011 | Cea et al. | 257/368 |
| 2011/0187004 A1* | 8/2011 | Park | 257/774 |
| 2012/0061838 A1* | 3/2012 | Edelstein et al. | 257/751 |
| 2013/0075862 A1* | 3/2013 | Rennie et al. | 257/532 |
| 2014/0203436 A1* | 7/2014 | Filippi et al. | 257/751 |

* cited by examiner

SEMICONDUCTOR STRUCTURES WITH METAL LINES

FIELD OF THE INVENTION

The invention relates to semiconductor structures and methods of manufacture and, more particularly, to semiconductor structures with metal lines and methods of manufacture which reduce or eliminate extrusion formation.

BACKGROUND

Semiconductor devices comprise active and passive devices. The active devices can be, for example, a transistor or thyristor. A passive device can be, for example, resistors, diodes, capacitors or even wires. As to wiring fabrication, typically several layers of metal are used. These metal layers typically comprise a layered structure of aluminum, copper and/or TiN.

In fabricating the wirings, though, stresses can build up in the aluminum or other metal layer during annealing processes, which result in hillock formation. More specifically, during the annealing process, stress in the metal line can be relieved via vertical hillock formation as the grain pushes up to relieve the compressive stress. It has been found, though, that hillock formation can be suppressed by using a constraining layer, e.g., $Si_3N_4$, on top of the metal level. However, the use of this constraining layer results in the wires relieving stress via extrusion formation, rather than via hillock formation.

More specifically, extrusions in the aluminum layer are formed in response to constraints on the metal shapes that limit the ability of the metal to expand in response to an increase in temperature (as in an annealing step). The extrusions nucleate at locations where the metal microstructure is favorable and grow by self diffusion within the metal film. Hence, both the magnitude of the temperature increase and the duration of the exposure to the high temperature work to increase the size of the extrusion. Extrusions can be very problematic, in that they tend to grow towards neighboring lines. This growth can short devices, resulting in reliability and product yield concerns.

SUMMARY

In an aspect of the invention, a method comprises forming a metal wiring comprising a layered structure of metal materials with an upper constraining layer. The method further comprises forming a film on the metal wiring which prevents metal extrusion during an annealing process.

In an aspect of the invention, a method comprises forming metal layers on a substrate, comprising deposition of an aluminum material sandwiched between at least two metal layers. The method further comprises forming a hillock prevention constraining layer on a top metal layer of the two metal layers. The method further comprises patterning the metal layers and the hillock prevention constraining layer to form at least one metal structure. The method further comprises forming an extrusion prevention film layer on the at least one metal structure, post patterning of the metal layers. The method further comprises annealing the at least one metal structure, wherein the extrusion prevention film layer prevents extrusion of the aluminum metal due to stresses caused by the annealing.

In an aspect of the invention, a structure comprises a metal wiring layer comprising an aluminum material sandwiched between at least two metal layers. The structure further comprises a hillock prevention constraining layer on a top metal layer of the two metal layers. The structure further comprises an extrusion prevention film layer on the at least one metal structure. The extrusion prevention film layer prevents extrusion of the aluminum material during an annealing process.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structures with metal lines, which comprises the structures of the present invention. In still further embodiments, a method in a computer-aided design system is provided for generating a functional design model of the semiconductor structures with metal lines. The method comprises generating a functional representation of the structural elements of the semiconductor structures with metal lines.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to semiconductor structures with metal lines and methods of manufacture. More specifically, the present invention comprises metal lines having a film layer to prevent and/or reduce formation of metal extrusions, e.g., metal extrusions forming from the metal lines. In embodiments, the film layer prevents and/or reduces formation of metal extrusions of aluminum in the metal line. The present invention is particularly useful for metal lines that are capped with a constraining layer, e.g., $Si_3N_4$.

In embodiments, the film layer can be a Low Temperature Oxide (LTO), e.g., $SiO_2$ film, applied prior to an annealing process, e.g., deuterium or oxygen or hydrogen or forming gas anneal. In alternative embodiments, the film layer can be an oxide material formed using PECVD (plasma enhanced chemical vapor deposition) processes. In still further embodiments, the PECVD process can use a nitride material to prevent or reduce the metal extrusions. In still further embodiments, the LTO and PECVD oxide or nitride can be blanket deposited over the entire structure, or alternatively, can be partially removed from a top surface of the metal lines. In the latter configuration, the LTO and PECVD oxide or nitride will remain on sidewalls of the metal lines or other structures, thereby preventing and/or reducing the metal extrusions.

In embodiments, the LTO and PECVD oxide or nitride can be formed post-etching of the metal layers, in order to serve as an insulation film around the Al. This insulating layer would prevent shorting between metal walls and islands, for example. Also, the LTO and PECVD oxide can be used with metal lines, MIMS (Metal-Insulator-Metal) structures, etc. Additionally, the LTO and PECVD oxide or nitride can be used with metal lines of different configurations and structures, e.g., having different combinations of metals used with aluminum. For example, the application of the film layer will prevent aluminum extrusions in metal lines comprising, to name a few contemplated combinations: (i) Al with a constraining layer, e.g., $Si_3N_4$, (ii) TiN—Al—TiN with a constraining layer, (iii) TiN—$TiAl_3$—Al—$TiAl_3$ with a constraining layer, or (iv) other Al based metal lines with a constraining layer.

Figure 1:
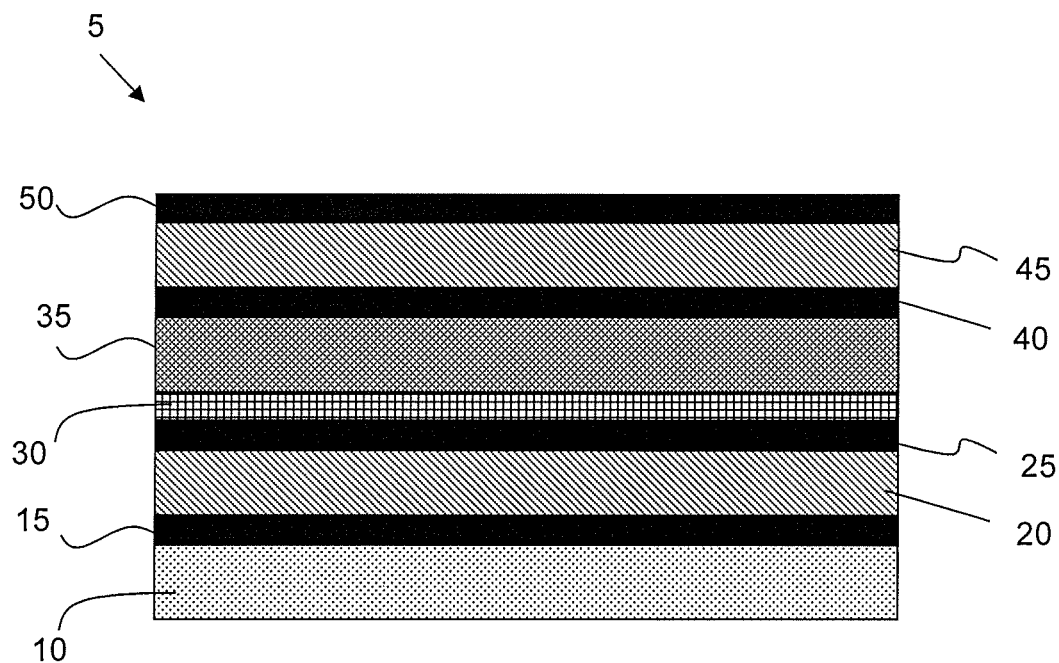
FIGS. 1-4 show cross-sectional views of semiconductor structures with metal lines and respective processes, in accordance with aspects of the present invention.

FIG. 1 shows a cross-sectional view of an exemplary semiconductor structure with metal lines, in accordance with aspects of the present invention. More specifically, the exemplary structure 5 of the present invention includes substrate 10. In embodiments, the substrate 10 can be any insulating material (interlevel dielectric material) such as, for example, $SiO_2$. A metal layer 15 is formed on the substrate 10. In embodiments, the metal layer 15 can be, for example, Ti, deposited to a thickness of about 100 Å to 250 Å, as an illustrative example. The deposition process for forming this metal layer 15 can be a metal sputter deposition method known to those of skill in the art. An aluminum layer 20 is deposited on the metal layer 15, preferably using a metal sputter deposition process. In embodiments, the aluminum layer 20 can be deposited to a thickness of about 4800 Å to about 7700 Å; although other dimensions are also contemplated by the present invention.

Still referring to FIG. 1, another metal layer 25 is formed on the aluminum layer 20. In embodiments, the metal layer 25 can be, for example, Ti, deposited to a thickness of about 100 Å to 250 Å, as an illustrative example. The deposition process for forming this metal layer 25 can also be a metal sputter deposition method known to this of skill in the art. Another metal layer 30, e.g., TiN, can be deposited on the metal layer 25. A constraining layer 35 of constraining material is formed on the metal layer 30. In embodiments, the constraining layer 35 is $Si_3N_4$, which is formed using conventional CVD processes. In additional embodiments, the constraining layer 35 is specifically engineered to provide necessary elastic properties allowing relief and relaxation with temperature, without compromising the film integrity. In additional embodiments, the constraining layer 35 can be doped with necessary seed atoms (e.g., N, O, C, etc.) to enhance elastic properties without compromising film integrity. Moreover, in embodiments, the constraining layer 35 can be made of composites such as oxynitride, or oxide, nitrogen and oxide thereby enhancing mechanical properties by providing constraint without compromising film integrity.

In embodiments, the constraining layer 35 can be deposited to a thickness of about 500 Å; although other dimensions are also contemplated by the present invention. Advantageously, the constraining layer 35 prevents hillock formation on the underlying metal layer during annealing processes, e.g., metal layer 30; however, it has also been found that the use of the constraining layer 35 can result in formation of aluminum extrusions due to stresses placed in the metal wiring during the annealing processes. This will be prevented, though, by the use of LTO or PECVD oxide or nitride, as described in more detail herein.

FIG. 1 also shows fabrication processes for forming an optional MIMS capacitor. In embodiments, the MIMS capacitor is formed by depositing additional layers 40, 45 and 50, over the constraining layer 35. More specifically, the additional layers 40, 45 and 50 comprise TiN, Al and TiN, respectively. These additional layers 40, 45 and 50 can be deposited using conventional metal sputtering processes. In embodiments, the TiN layers 40 and 50 can be deposited to a thickness of about 100 Å, whereas, the Al layer 45 can be deposited to a thickness of about 2000 Å; although other thicknesses are contemplated by the present invention. It should be understood by those of skill in the art that the MIMS capacitor will not exhibit any extrusion of the Al layer, as a constraining layer is not deposited over the structure.

Figure 2:
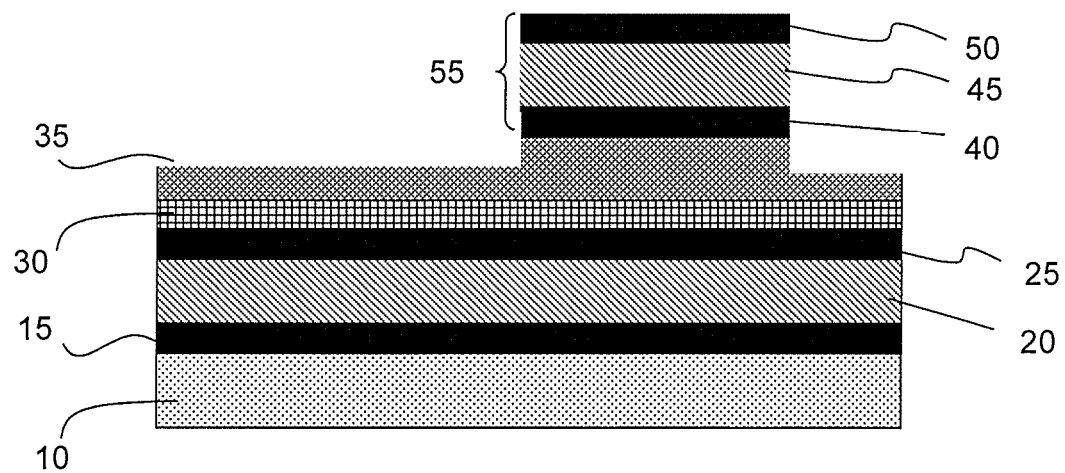

In FIG. 2, the additional layers 40, 45 and 50 are patterned to form a structure 55. In embodiments, the constraining layer 35 is also partially patterned. The patterning of the additional layers 40, 45 and 50 (and constraining layer 35) can be performed by conventional lithography and etching processes. For example, a resist can be formed over the additional layer 50 and exposed to energy (e.g., light) to form a pattern (opening). A reactive ion etching (RIE) can be performed through the opening to remove portions of the additional layers 40, 45 and 50 (and constraining layer 35), to form the structure 55.

Figure 3:
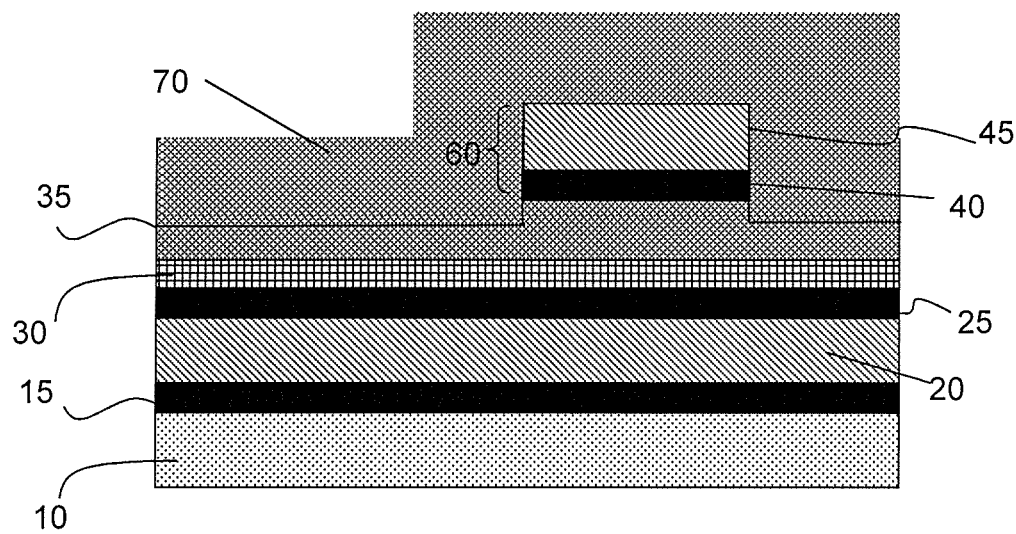

In FIG. 3, the structure 55 of FIG. 2 will undergo a surface treatment process to remove the layer 50. In this way, a MIMS capacitor 60 can be formed. In embodiments, the surface treatment can be, for example, a chemical mechanical polishing (CMP). After surface treatment, a conformal layer of insulator material 70 can be formed over the exposed surfaces of layers 35 and 45. In embodiments, the insulator layer 70 can be a constraining layer of $Si_3N_4$, as an example. The insulator layer 70 can be deposited to a thickness of about 700 Å, using a conventional CVD process. In embodiments, the present invention contemplates other thicknesses of the insulator layer 70.

Figure 4:
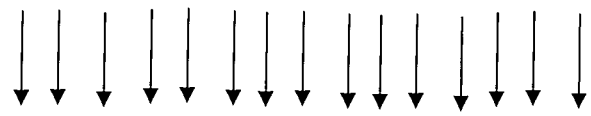
Figure 4:
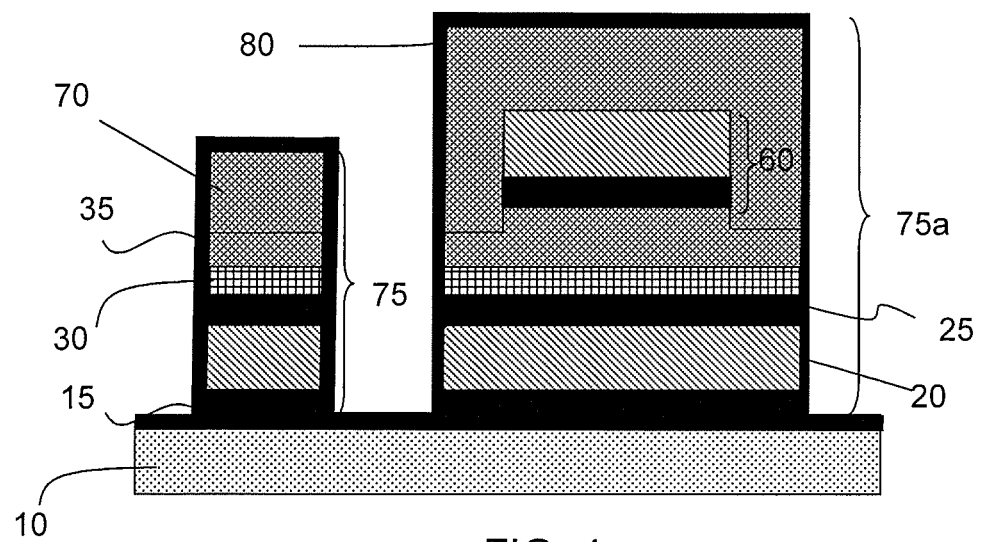

FIG. 4 shows additional fabrication processes in accordance with the present invention. In particular, the structure undergoes lithography and etching (patterning) process to form wires 75 and other metal based structures 75a (e.g., island 75a). For example, a resist is formed over the MIMS capacitor 60 and exposed portions of the insulator layer 70, and exposed to energy (light) to form a pattern. An etching process (RIE) is then performed to form the wires 75 and other structures (e.g., islands 75a).

A film layer 80 (e.g., constraining layer) is deposited on the formed structures, e.g., wires 75 and islands 75a, after post-etching of the metal, e.g., blanket deposited on the exposed surfaces of each of the layers and structures. In embodiments, the film layer 80 serves as an insulation film around the aluminum, e.g., wires 75, preventing shorting between metal walls of the wires 75 and islands 75a. Also, as described in more detail below, the film layer 80 will also prevent formation of post-anneal extrusions of the aluminum, due to its confining properties.

In embodiments, the film layer 80 can be, for example, a Low Temperature Oxide (LTO), e.g., $SiO_2$ film, applied prior to an annealing process, e.g., deuterium or oxygen or hydrogen or forming gas anneal. In embodiments, the LTO can be deposited at a temperature of about 190° C. to about 200° C., with development of a LTO process below 190° C. yielding even greater improvements (as the process appears to be modulated by temperature). The LTO can be deposited to a thickness of about 100 Å to about 1200 Å, and more preferably about 200 Å to about 1000 Å, and even more preferably about 200 Å to about 800 Å.

In alternative embodiments, the film layer 80 can be an oxide material formed using PECVD (plasma enhanced chemical vapor deposition) processes. In still further embodiments, the PECVD process can use a nitride material. In the PECVD processes, the thin film can be deposited at temperatures higher than the LTO, e.g., about 400° C.; although, other temperature ranges may also be available. The oxide or nitride can be deposited to a thickness of about 100 Å to about 1200 Å, and more preferably about 200 Å to about 1000 Å and, even more preferably about 200 Å to about 800 Å.

Advantageously, PECVD processes are compositionally and mechanically similar to later deposition of thicker PECVD oxide layers, resulting in no material change in processing steps. For example, MIMS fabrication can use PECVD processes, thus allowing the processes of the present invention to easily integrate with that of the process of record (POR) for other structures. The PECVD processes also require short deposition time, which limits long-distance diffusion needed to grow extrusions. The short deposition time required for PECVD processes also reduces compressive stress and reduces the net shrinkage after full oxide deposition, while also enabling reduction in internal compressive stress (through hillock growth), thereby reducing the driving force for extrusion growth.

Still referring to FIG. 4, the structure will undergo an annealing process. In embodiments, the annealing process can be oxygen or deuterium anneal, for example; although other annealing processes are also contemplated by the present invention. In embodiments, the annealing temperature can be about 400° C.; although other annealing temperatures are also contemplated by the present invention. As should be understood by those of skill in the art, the annealing process will cause migration of nitride and aluminum from the TiN layer 30 and aluminum layer 20, respectively, resulting in $TiAl_3$ layers 15 and 25.

Table 1 below shows experimental data demonstrating the improvements of the present invention, compared to processes of record (POR). The experimental data is based on multiple wafers from two lots.

TABLE 1

| SAMPLES | PROCESS | # DEFECTS |
| --- | --- | --- |
| 1 | 800 Å HDP | 0 |
| 2 | 800 Å HDP | 0 |
| 3 | NO DEPOSITION | 480 |
| 4 | NO DEPOSITION | 539 |
| 5 | 800 Å LTO | 0 |
| 6 | 800 Å LTO | 0 |
| 7 | 200 Å LTO | 32 (NOT ALL EXTRUSIONS) |
| 8 | 200 Å LTO | 60 (NOT ALL EXTRUSIONS) |
| 9 | NO LTO | 2225 |
| 10 | NO LTO | 2366 |
| 11 | POR | 2899 |
| 12 | POR | 1946 |

As shown from the above table, there is a significant reduction in the number of extrusions using the 200 Å and 800 Å LTO processes. The data also suggests that 800 Å LTO may be an optimal thickness, since no defects were found at this thickness. This data also suggests that PECVD processes (e.g., represented HDP) also yield improvements over POR (which resulted in thousands of defects, e.g., extrusions).

Also, the wafers were tested for voiding using kerf structures for detecting of such voids. Advantageously, the test results suggest that no voids would be formed in the wires 75, e.g., near the constraining layer 80. Thus, not only does the present invention achieve the advantage of enveloping the metal to constrain such metal in order to reduce and/or eliminate extrusions of the aluminum (or other metal layer), it also provides an insulating film to prevent shorting metal structures while not contributing to any voiding issues.

Figure 5:
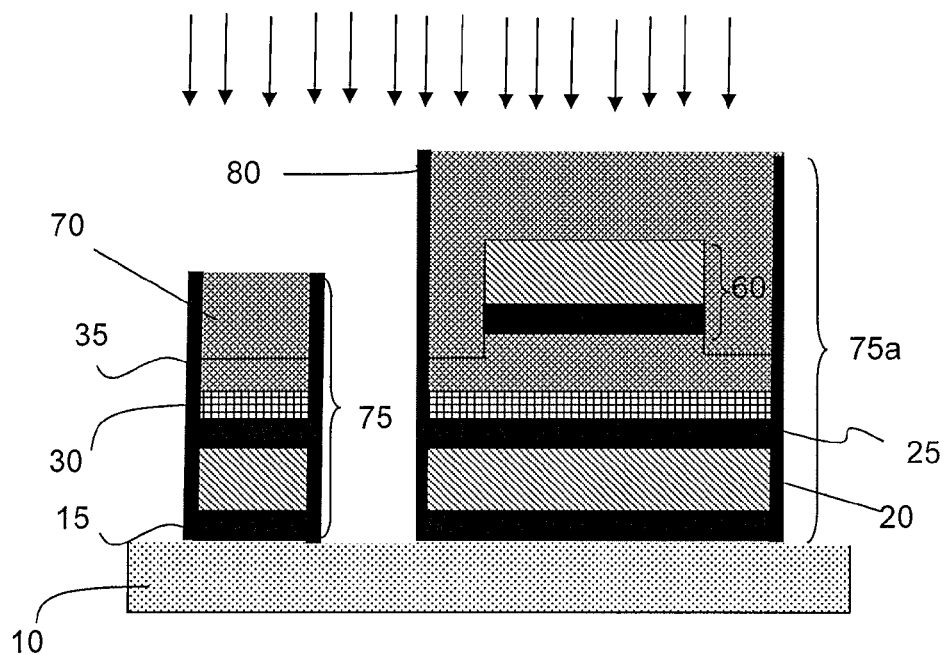
FIG. 5 shows a cross-sectional view of a semiconductor structure with metal lines and respective processes, in accordance with alternative aspects of the present invention.

FIG. 5 shows an alternative embodiment in accordance with aspects of the present invention. In this embodiment, portions of the film layer 80 can be removed from top surfaces of the structure. In embodiments, the film layer 80 can be removed by an anisotropic etching process or a polishing process, e.g., CMP. In this way, the film layer 80 will remain on sidewalls of the wiring 75 and other structures. In the optional embodiments, the film layer 80 can also remain on the MIMS capacitor 60. After this etching process, the structure of FIG. 5 can then undergo an annealing process, similar to that disclosed with reference to FIG. 4.

Figure 6:
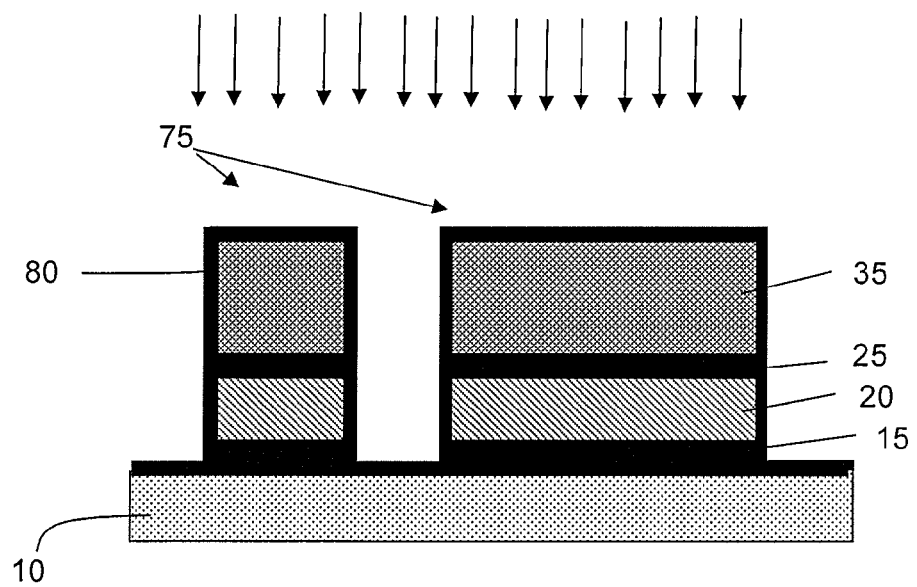
FIG. 6 shows a cross-sectional view of a semiconductor structure with metal lines and respective processes, in accordance with alternative aspects of the present invention.

FIG. 6 shows an alternative structure and respective processing steps in accordance with the present invention. In this alternative embodiment, the wires 75 are composed of a stack of TiN—Al—TiN, i.e., layers 15, 20 and 25. It should be recognized, though, that the layers shown in FIG. 6 can be representative of other metal layers such as any aluminum based metal lines with a constraining layer 35. In these embodiments, the layers are patterned to form wires 75, using conventional lithography and etching processes as described herein. The film layer 80 can be formed over the wires 80, post-anneal, and the structure then undergoes an annealing process as described herein.

Figure 7:
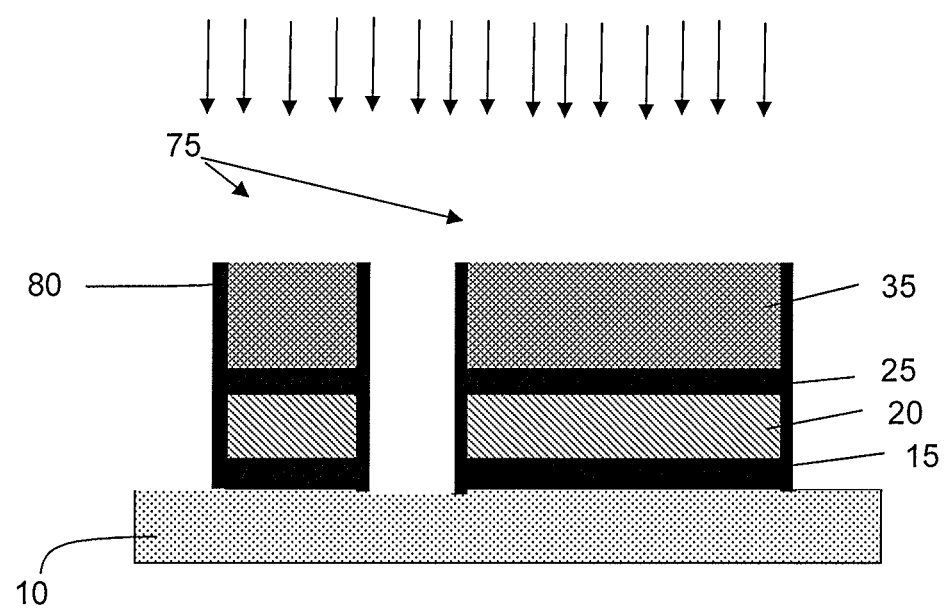
FIG. 7 shows a cross-sectional view of a semiconductor structure with metal lines and respective processes, in accordance with alternative aspects of the present invention.

As in other embodiments, the film layer can be an LTO or PECVD oxide or nitride, as an example, which provides insulative properties, as well as prevents extrusion formation from the aluminum layer, post annealing process. Also, it should be understood by those of skill in the art that the film layer 80 can be removed on upper surfaces of the wires using anisotropic etching processes as shown in FIG. 7.

Figure 8:
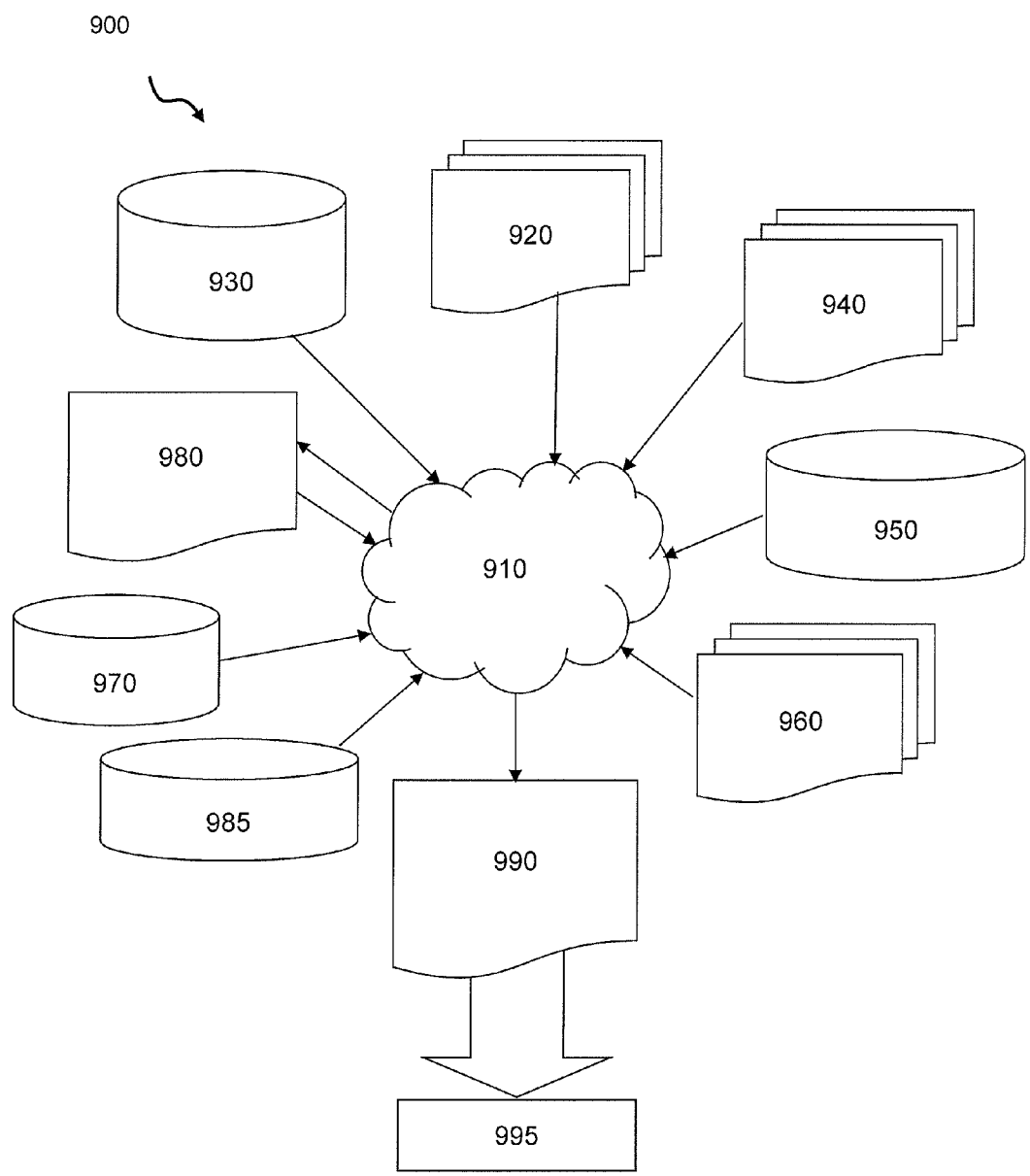
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming a plurality of metal wirings each comprising a layered structure of metal materials with an upper constraining layer; and
    forming a film on the metal wirings, the film being structured to discretely cover each of the metal wirings; and
    after the forming of the film, annealing the metal wirings and the film,
    wherein the film is structured to prevent metal extrusion from the metal wirings which it discretely covers during the annealing.

2. The method of claim 1, further comprising forming a metal-insulator-metal (MIM) capacitor on a metal island, adjacent to the metal wiring, and wherein the film discretely covers the metal wiring and the metal island.

3. The method of claim 2, wherein the forming of the film is a low temperature oxide (LTO) deposition process formed over the metal wiring and MIM capacitor on the metal island.

4. The method of claim 1, wherein the forming of the film is a low temperature oxide (LTO) deposition process formed over the metal wiring.

5. The method of claim 1, wherein the film is formed to a thickness of about 200 Å to about 800 Å.

6. The method of claim 4, wherein the LTO deposition process is performed at about 190° C. to about 200° C.

7. The method of claim 4, further comprising removing a portion of the film from a top surface of the metal wiring, leaving film sidewalls that prevent the formation of the metal extrusion.

8. The method of claim 1, wherein the forming of the film is a plasma enhanced chemical vapor deposition (PECVD) process using an oxide or nitride material.

9. The method of claim 8, further comprising removing a portion of the film from a top surface of the metal wiring, leaving oxide or nitride film sidewalls that prevent the formation of the metal extrusion.

10. The method of claim 1, wherein:
    the forming of the metal wiring comprises forming a layered structure of metal including an aluminum layer under the upper constraining layer; and
    the film prevents aluminum extrusion formation during the annealing process.

11. The method of claim 1, wherein the upper constraining layer has elastic properties allowing relief and relaxation with temperature.

12. The method of claim 1, wherein the upper constraining layer is doped with seed atoms to enhance elastic properties.

13. The method of claim 1, wherein the upper constraining layer is a composite comprising one of oxynitride, or oxide, nitrogen and oxide.

14. A method, comprising:
    forming metal layers on a substrate, comprising deposition of an aluminum material sandwiched between at least two metal layers;
    forming a hillock prevention constraining layer on a top metal layer of the two metal layers;
    patterning the metal layers and the hillock prevention constraining layer to form at least one metal structure;
    forming an extrusion prevention film layer on the at least one metal structure, post patterning of the metal layers, the extrusion prevention film being structured to discretely cover the at least one metal structure; and
    annealing the at least one metal structure with the extrusion prevention film layer thereon, wherein the extrusion prevention film layer is structure to prevent extrusion of the aluminum metal from the at least one metal structure due to stresses caused by the annealing.

15. The method of claim 14, wherein:
    the at least two metal layers are TiN;
    the constraining layer is $Si_3N_4$; and
    the annealing is deuterium or hydrogen or forming gas anneal.

16. The method of claim 14, wherein the forming of the extrusion prevention film layer comprises a low temperature oxide (LTO) deposition process formed over the metal wiring and MIM capacitor on a metal island, adjacent to the at least one metal structure, wherein the extrusion prevention film separately discretely covers the metal island and the at least one metal structure.

17. The method of claim 14, wherein the forming of the extrusion prevention film layer is a low temperature oxide (LTO) deposition process formed over the at least one metal structure.

18. The method of claim 17, wherein the LTO deposition process is performed at about 190° C. to about 200° C.

19. The method of claim 15, wherein the extrusion prevention film layer is blanket deposited over the at least one metal structure and is subsequently removed from a top surface thereof, leaving film sidewalls.

20. The method of claim 1, wherein:
    the film layer is an oxide based film, which is formed post etching of the metal wiring formed to a thickness of about 200 Å to about 800 Å;
    the metal wiring is a MIMS capacitor which undergoes a surface treatment process to remove an upper metal layer and a conformal deposition process to form an insulator material on a top surface;
    the upper constraining layer is deposited on a top layer of metal prior to the forming of the metal wiring by an etching process.

* * * * *